US012770545B2

(12) United States Patent
Feng et al.

(10) Patent No.: US 12,770,545 B2
(45) Date of Patent: Oct. 20, 2026

(54) SHIFT REGISTER UNIT, GATE DRIVING CIRCUIT, AND DISPLAY DEVICE

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN)

(73) Assignees: Hefei BOE Joint Technology Co., Ltd., Hefei (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 18/992,168

(22) PCT Filed: May 16, 2024

(86) PCT No.: PCT/CN2024/093731
§ 371 (c)(1),
(2) Date: Jan. 7, 2025

(87) PCT Pub. No.: WO2024/260181
PCT Pub. Date: Dec. 26, 2024

(65) Prior Publication Data

US 2026/0011281 A1 Jan. 8, 2026

(30) Foreign Application Priority Data

Jun. 19, 2023 (CN) ......................... 202310738663.2

(51) Int. Cl.
*G09G 3/20* (2006.01)
*G11C 19/28* (2006.01)

(52) U.S. Cl.
CPC ... *G09G 3/2092* (2013.01); *G09G 2310/0286* (2013.01); *G09G 2320/045* (2013.01); *G11C 19/287* (2013.01)

(58) Field of Classification Search
CPC ......... G09G 3/2092; G09G 2310/0286; G09G 2320/045; G09G 3/3266; G09G 3/3677; G09G 3/20; G11C 19/287; G11C 19/28
See application file for complete search history.

(56) References Cited

U.S. PATENT DOCUMENTS

2007/0296662 A1* 12/2007 Lee ...................... G09G 3/3677 345/87
2016/0163401 A1* 6/2016 Nonaka ................ G09G 3/3677 345/214
2018/0090072 A1* 3/2018 Sun ...................... G09G 3/3266
2019/0073949 A1* 3/2019 Zhang .................. G11C 19/184
(Continued)

FOREIGN PATENT DOCUMENTS

CN 106847221 A 6/2017
CN 108346405 A 7/2018
(Continued)

*Primary Examiner* — Jose R Soto Lopez
(74) *Attorney, Agent, or Firm* — IPro, PLLC

(57) ABSTRACT

A shift register unit, a gate driving circuit and a display device are disclosed. The shift register unit includes a shift register and a voltage adjusting circuit. The voltage adjusting circuit is coupled to a set node of the shift register. In a working process, the voltage adjusting circuit is configured to adjust a voltage of the set node in response to a signal of a first clock signal terminal.

10 Claims, 6 Drawing Sheets

(56) References Cited

U.S. PATENT DOCUMENTS

| | | | | |
|---|---|---|---|---|
| 2020/0294436 | A1* | 9/2020 | Lai | G11C 19/28 |
| 2022/0036798 | A1* | 2/2022 | Feng | G09G 3/2092 |
| 2024/0172508 | A1* | 5/2024 | Xu | G02F 1/136286 |
| 2024/0185793 | A1* | 6/2024 | Feng | G09G 3/20 |

FOREIGN PATENT DOCUMENTS

| | | | |
|---|---|---|---|
| CN | 113113071 | A | 7/2021 |
| CN | 116798497 | A | 9/2023 |

* cited by examiner

SHIFT REGISTER UNIT, GATE DRIVING CIRCUIT, AND DISPLAY DEVICE

CROSS-REFERENCE TO RELATED APPLICATION

This application is a National Stage of International Application No. PCT/CN2024/093731, filed on May 16, 2024, which claims priority to Chinese Patent Application No. 202310738663.2, filed on Jun. 19, 2023, and entitled "Shift Register Unit, Gate Driving Circuit, and Display Device", the content of which is hereby incorporated by reference in its entirety.

TECHNICAL FIELD

The present disclosure relates to the field of display technology, and in particular to a shift register unit, a gate driving circuit and a display device.

BACKGROUND

At present, during a working process of a shift register unit, a related transistor is subjected to a large voltage impact, because a negative drift of the related transistor during the working process is large, resulting in an impact on service life of the related transistor.

SUMMARY

Embodiments of the present disclosure provide a shift register unit, a gate driving circuit and a display device, for reducing the impact of the negative drift on the voltage of the related transistor and prolonging the service life of the related transistor.

Specific solutions according to the present disclosure are as follows.

In a first aspect, embodiments of the present disclosure provide a shift register unit, including:

- a shift register; and
- a voltage adjusting circuit, coupled to a set node of the shift register, and configured to adjust a voltage of the set node in response to a signal of a first clock signal terminal.

Optionally, the set node includes a pull-up node, the voltage adjusting circuit includes a first capacitor;

a first terminal of the first capacitor is coupled to the first clock signal terminal, and a second terminal of the first capacitor is coupled to the pull-up node.

Optionally, the set node includes a pull-down node, the voltage adjusting circuit further includes a second capacitor;

- a first terminal of the second capacitor is coupled to the first clock signal terminal, and a second terminal of the second capacitor is coupled to the pull-down node.

Optionally, the shift register includes:

- an input circuit, configured to provide a signal of an input signal terminal to a pull-down node in response to the signal of the first clock signal terminal;
- a node control circuit, configured to control a signal of a pull-up node and a signal of the pull-down node;
- an output circuit, configured to provide a signal of a first reference signal terminal to an output terminal in response to the signal of the pull-up node, and provide a signal of a second clock signal terminal to the output terminal in response to the signal of the pull-down node.

Optionally, the input circuit includes: a first transistor;

- a control terminal of the first transistor is coupled to the first clock signal terminal, a first terminal of the first transistor is coupled to the input signal terminal, and a second terminal of the first transistor is coupled to the pull-down node.

Optionally, the node control circuit includes a second transistor, a third transistor, a fourth transistor, and a fifth transistor;

- a control terminal of the second transistor is coupled to the first clock signal terminal, a first terminal of the second transistor is coupled to a second reference signal terminal, and a second terminal of the second transistor is coupled to the pull-up node;
- a control terminal of the third transistor is coupled to a second terminal of a first transistor, a first terminal of the third transistor is coupled to the pull-up node, and a second terminal of the third transistor is coupled to the first clock signal terminal;
- a control terminal of the fourth transistor is coupled to the pull-up node, a first terminal of the fourth transistor is coupled to the first reference signal terminal, and a second terminal of the fourth transistor is coupled to a first terminal of the fifth transistor;
- a control terminal of the fifth transistor is coupled to the second clock signal terminal, and a second terminal of the fifth transistor is coupled to the pull-down node.

Optionally, the output circuit includes a sixth transistor and a seventh transistor;

- a control terminal of the sixth transistor is coupled to the pull-down node, a first terminal of the sixth transistor is coupled to the output terminal, and a second terminal of the sixth transistor is coupled to the second clock signal terminal;
- a control terminal of the seventh transistor is coupled to the pull-up node, a first terminal of the seventh transistor is coupled to the first reference signal terminal, and a second terminal of the seventh transistor is coupled to the output terminal.

Optionally, the output circuit further includes a third capacitor;

- a first terminal of the third capacitor is coupled to the first reference signal terminal, and a second terminal of the third capacitor is coupled to the pull-up node.

Optionally, the output circuit further includes a fourth capacitor;

- a first terminal of the fourth capacitor is coupled to the output terminal, and a second terminal of the fourth capacitor is coupled to the pull-down node.

In a second aspect, embodiments of the present disclosure provide a gate driving circuit, including: a plurality of cascaded shift register units each according to the above shift register unit; where:

- an input signal terminal of a shift register unit of a first stage is configured to be coupled to a frame start signal terminal; and
- in every two adjacent shift register units, an input signal terminal of a shift register unit of a next stage is configured to be coupled to an output terminal of a shift register unit of a previous stage.

In a third aspect, embodiments of the present disclosure provide a display device, including the gate driving circuit.

In a third aspect, embodiments of the present disclosure provide a driving method of a shift register, including:

- outputting, by the shift register, a driving signal;
- adjusting, by a voltage adjusting circuit, a voltage of a set node in response to a signal of a first clock signal terminal.

Advantages of the present disclosure are as follows.

In summary, embodiments of the present disclosure provide a shift register unit, a gate driving circuit and a display device. The shift register unit includes a shift register and a voltage adjusting circuit. The voltage adjusting circuit is coupled to a set node of the shift register. In a working process, the voltage adjusting circuit is configured to adjust a voltage of the set node in response to a signal of a first clock signal terminal. That is, adjustment of the voltage of the set node is realized through arrangement of the voltage adjusting circuit, therefore, voltage fluctuation of the related transistor connected with the set node is effectively reduced, and the service life of the related transistor is prolonged.

Additional features and advantages of the present disclosure will be set forth in the following description and may be obvious from the description partially, or may be learned by practice of the present disclosure. Objects and other advantages of the present disclosure may be realized and obtained by structures particularly pointed out in the description, claims, and drawings.

BRIEF DESCRIPTION OF FIGURES

The accompanying drawings described herein are intended to provide further understanding of the present disclosure and form a part of the present disclosure. The illustrative embodiments and their descriptions of the present disclosure are used to explain the present disclosure and do not constitute undue limitations on the present disclosure.

DETAILED DESCRIPTION

For making objectives, technical solutions and advantages of embodiments of the present disclosure clearer, technical solutions of embodiments of the present disclosure will be clearly and completely described below in combination with accompanying drawings in embodiments of the present disclosure. Apparently, embodiments described are some rather than all of embodiments of the present disclosure. Based on embodiments of the present disclosure, all other embodiments obtained by those of ordinary skill in the art without making creative efforts fall within the scope of protection of the present disclosure.

The terms "first", "second", etc. in the specification and claims of the present disclosure and the accompanying drawings are used to distinguish similar objects and do not necessarily need to be used to describe a specific order or sequence. It should be understood that the data used in this way can be interchanged in appropriate circumstances, so that embodiments of the present disclosure described herein can be implemented in a sequence other than those illustrated or described herein.

In the related art, in the working process of the shift register unit, the related transistor is subjected to a large voltage impact, that is, the negative drift of the related transistor in the working process is large, resulting in an impact on service life of the related transistor.

Figure 1:
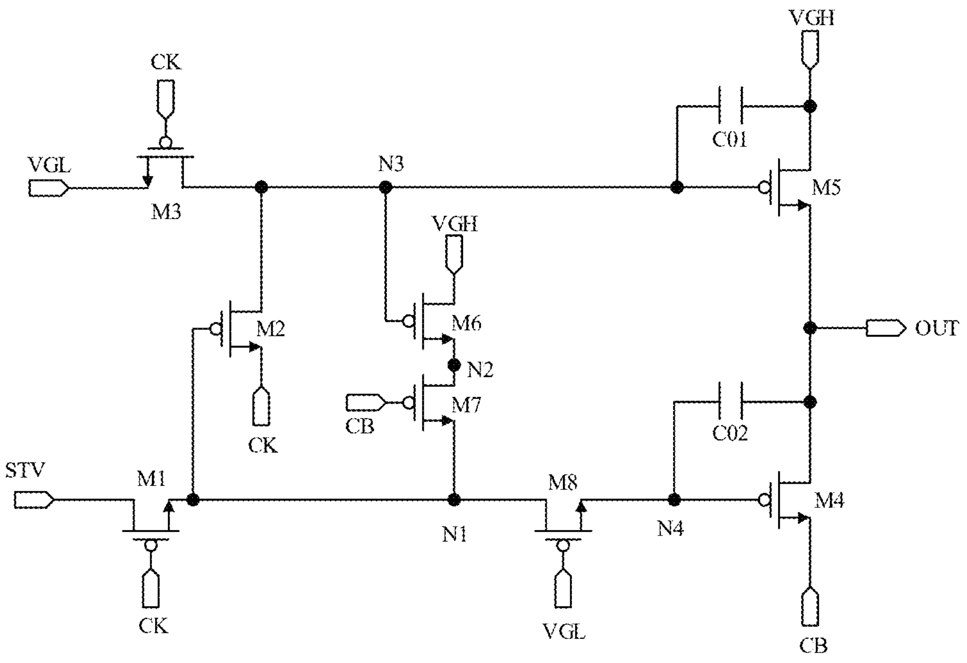
FIG. 1 is a schematic diagram of a shift register unit in related art.

Referring to FIG. 1, after a voltage of a second reference signal terminal VGL is provided to a node N3 through a M3 transistor turned on, gate-source voltages of a M5 transistor and a M6 transistor are Vgs=VGL−VGH=−5V−10V=−15V. In this case, related transistors of the M5 transistor and the M6 transistor connected with the pull-up node N3 are subjected to a large voltage impact, negative drifts of the M5 transistor and the M6 transistor are large, resulting in an impact on service life of the M5 transistor and the M6 transistor.

Embodiments of the present disclosure will now be described in detail with reference to the accompanying drawings.

Figure 2:
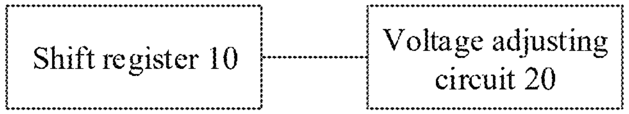
FIG. 2 is a schematic diagram of an internal connection of a shift register unit according to an embodiment of the present disclosure.

Referring to FIG. 2, in an embodiment of the present disclosure, a shift register unit includes a shift register 10 and a voltage adjusting circuit 20.

Figure 3:
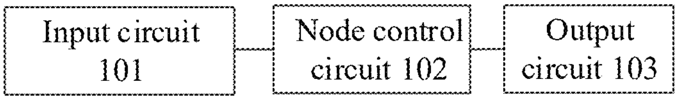
FIG. 3 is a schematic diagram of internal connections of a shift register according to an embodiment of the present disclosure.

Referring to FIG. 3, the shift register 10 includes an input circuit 101, a node control circuit 102, and an output circuit 103.

During implementation, the input circuit 101 is configured to provide a signal of an input signal terminal STV to a pull-down node N1 in response to a signal of a first clock signal terminal CK.

During implementation, the node control circuit 102 is configured to control a signal of a pull-up node N3 and a signal of the pull-down node N1.

During implementation, the output circuit 103 is configured to provide a signal of a first reference signal terminal VGH to an output terminal OUT in response to the signal of the pull-up node N3, and provide a signal of a second clock signal terminal CB to the output terminal OUT in response to the signal of the pull-down node N1.

The shift register 10 is described in detail below in combination with a circuit diagram.

Figure 4:
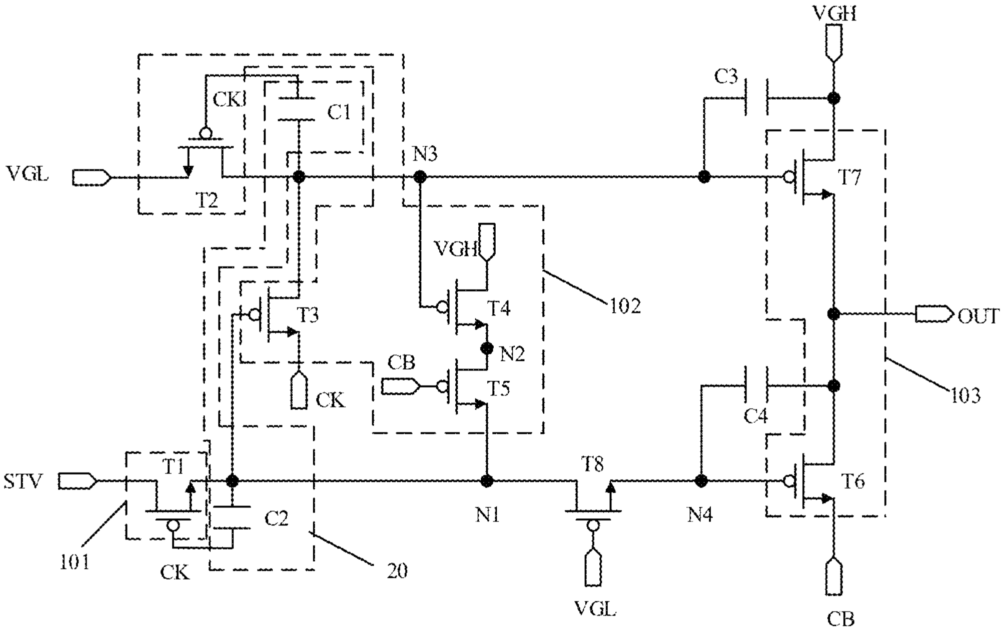
FIG. 4 is a circuit connection diagram of a first shift register unit according to an embodiment of the present disclosure.

Referring to FIG. 4, the input circuit includes a first transistor T1.

Connection relationships between the first transistor T1 and other components in FIG. 4 are: a control terminal of the first transistor T1 is coupled to the first clock signal terminal CK, a first terminal of the first transistor T1 is coupled to the input signal terminal STV, and a second terminal of the first transistor T1 is coupled to the pull-down node N1.

During implementation, when the first clock signal terminal CK is at a low voltage, the first transistor T1 is turned on, a low voltage at the input signal terminal STV is output to the pull-down node N1 through the first transistor T1, so that the pull-down node N1 is at the low voltage.

When the first clock signal terminal CK is at a low voltage, the first transistor T1 is turned on, a high voltage at the input signal terminal STV is output to the pull-down node N1 through the first transistor T1, so that the pull-down node N1 is at the high voltage.

Referring to FIG. 4, optionally, the node control circuit includes a second transistor T2, a third transistor T3, a fourth transistor T4, and a fifth transistor T5.

Connection relationships between the second transistor T2 and other components in FIG. 4 are: a control terminal of the second transistor T2 is coupled to the first clock signal terminal CK, a first terminal of the second transistor T2 is coupled to a second reference signal terminal VGL, and a second terminal of the second transistor T2 is coupled to the pull-up node N3.

Connection relationships between the third transistor T3 and other components in FIG. 4 are: a control terminal of the third transistor T3 is connected to the second terminal of the first transistor T1, a first terminal of the third transistor T3 is coupled to the pull-up node N3, and a second terminal of the third transistor T3 is coupled to the first clock signal terminal CK.

Connection relationships between the fourth transistor T4 and other components in FIG. 4 are: a control terminal of the fourth transistor T4 is coupled to the pull-up node N3, a first terminal of the fourth transistor T4 is coupled to the first reference signal terminal VGH, and a second terminal of the fourth transistor T4 is coupled to a first terminal of the fifth transistor T5.

Connection relationships between the fifth transistor T5 and other components in FIG. 4 are: a control terminal of the fifth transistor T5 is coupled to the second clock signal terminal CB, and a second terminal of the fifth transistor T5 is coupled to the pull-down node N1.

During implementation, when the pull-down node N1 is at a low voltage, the third transistor T3 is turned on, a high voltage at the first clock signal terminal CK flows to the pull-up node N3 through the third transistor T3 turned on, so that the pull-up node N3 is at a high voltage.

When the first clock signal terminal CK is at a low voltage, the second transistor T2 is turned on, a low voltage at the second reference signal terminal VGL flows to the pull-up node N3 through the second transistor T2 turned on, a low voltage at the second reference signal terminal VGL achieves a reset of the pull-up node N3.

During implementation, when the pull-up node N3 is at a low voltage, the fourth transistor T4 is turned on, a high voltage at the first reference signal terminal VGH reaches the node N2 through the fourth transistor T4 turned on. Furthermore, when the second clock signal terminal CB is at a low voltage, the fifth transistor T5 is turned on, a high voltage at the node N2 reaches the pull-down node N1 through the fifth transistor T5 turned on, causing the pull-down node N1 to be at a high voltage.

Furthermore, when the second clock signal terminal CB is at a low voltage, the fifth transistor T5 is turned on, a high voltage of the first reference signal terminal VGH reaches the pull-down node N1 through the fourth transistor T4 turned on and the fifth transistor T5 turned on, causing the pull-down node N1 to be at a high voltage.

Optionally, the output circuit includes a sixth transistor T6 and a seventh transistor T7.

Connection relationships between the sixth transistor T6 and other components in FIG. 4 are: a control terminal of the sixth transistor T6 is coupled to the pull-down node N1, a first terminal of the sixth transistor T6 is coupled to the output terminal OUT, and a second terminal of the sixth transistor T6 is coupled to the second clock signal terminal CB.

During implementation, when the pull-down node N1 is at a low voltage, the sixth transistor T6 is turned on, a signal of the second clock signal terminal CB reaches the output terminal OUT through the sixth transistor T6 turned on.

It should be noted that in order to control the pull-down node N1, the shift register is further provided with an eighth transistor T8. A gate of the eighth transistor T8 is coupled to the second reference signal terminal VGL, a first terminal of the eighth transistor T8 is coupled to the second terminal of the first transistor T1, and a second terminal of the eighth transistor T8 is coupled to a gate of the sixth transistor T6.

During implementation, when the second reference signal terminal VGL is at a low voltage, the eighth transistor T8 is turned on, a signal of the input signal terminal STV reaches the sixth transistor T6 through the eighth transistor T8 turned on, ensuring normal turn-on of the sixth transistor T6.

Connection relationships between the seventh transistor T7 and other components in FIG. 4 are: a control terminal of the seventh transistor T7 is coupled to the pull-up node N3, a first terminal of the seventh transistor T7 is coupled to the first reference signal terminal VGH, and a second terminal of the seventh transistor T7 is coupled to the output terminal OUT.

During implementation, when the pull-up node N3 is at a low voltage, the seventh transistor T7 is turned on, a high voltage signal of the first reference signal terminal VGH reaches the output terminal OUT through the seventh transistor T7 turned on, and is output.

Referring to FIG. 4, the output circuit further includes a third capacitor C3.

Connection relationships between the third capacitor C3 and other components in FIG. 4 are: a first terminal of the third capacitor C3 is coupled to the first reference signal terminal VGH, and a second terminal of the third capacitor C3 is coupled to the pull-up node N3.

During implementation, the third capacitor C3 is mainly configured to store a low voltage signal of the pull-up node N3, to ensure that the seventh transistor T7 is normally turned on in a next time sequence.

Similarly, referring to FIG. 4, the output circuit further includes a fourth capacitor C4.

Connection relationships between the fourth capacitor C4 and other components in FIG. 4 are: a first terminal of the fourth capacitor C4 is coupled to the output terminal OUT, and a second terminal of the fourth capacitor C4 is coupled to the pull-down node N1.

During implementation, the fourth capacitor C4 is mainly configured to store a low voltage signal of the pull-down node N1, to ensure that the sixth transistor T6 is normally turned on in a next time sequence.

The voltage adjusting circuit 20 is described in detail below in combination with a circuit diagram.

The voltage adjusting circuit 20 is coupled to a set node of the shift register, and configured to adjust a voltage of the set node in response to a signal of a first clock signal terminal CK.

Considering that the set node of the shift register includes two types of nodes of a pull-up node N3 and a pull-down node N1, in an embodiment of the present disclosure, correspondingly, the voltage adjusting circuit 20 is described in two cases according to a specific type of the set node connected. In a first case, when the set node includes the pull-up node N3, the voltage adjusting circuit 20 includes a first capacitor C1. In a second case, when the set node includes the pull-down node N1, the voltage adjusting circuit 20 includes a second capacitor C2. The following is a detailed introduction.

Figure 5:
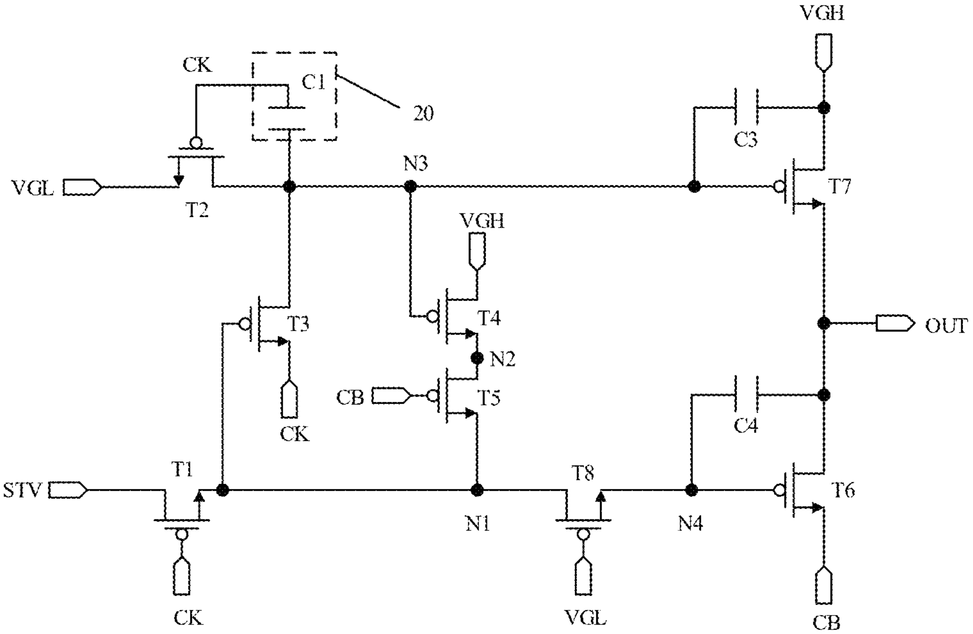
FIG. 5 is a circuit connection diagram of a second shift register unit according to an embodiment of the present disclosure.

Referring to FIG. 5, in the first case, the set node includes the pull-up node N3, and the voltage adjusting circuit 20 includes the first capacitor C1.

A first terminal of the first capacitor C1 is coupled to the first clock signal terminal CK, and a second terminal of the first capacitor C1 is coupled to the pull-up node N3.

During implementation, when a signal at the first clock signal terminal CK changes from low to high, that is, during a turn-off process of the second transistor T2, a voltage of the pull-up node N3 is raised by the first capacitor C1, and in general, the voltage of the pull-up node N3 can be raised by 2 V to 3 V. In this way, the voltage impact on the voltage of the pull-up node N3 can be effectively alleviated, and gate-source voltages of the fourth transistor T4 and the seventh transistor T7 are Vgs=VGL-VGH=−2V-10V=−12V. Negative drifts of the fourth transistor T4 and the seventh transistor T7 are reduced, effectively ensuring the service life of the fourth transistor T4 and the seventh transistor T7.

Figure 6:
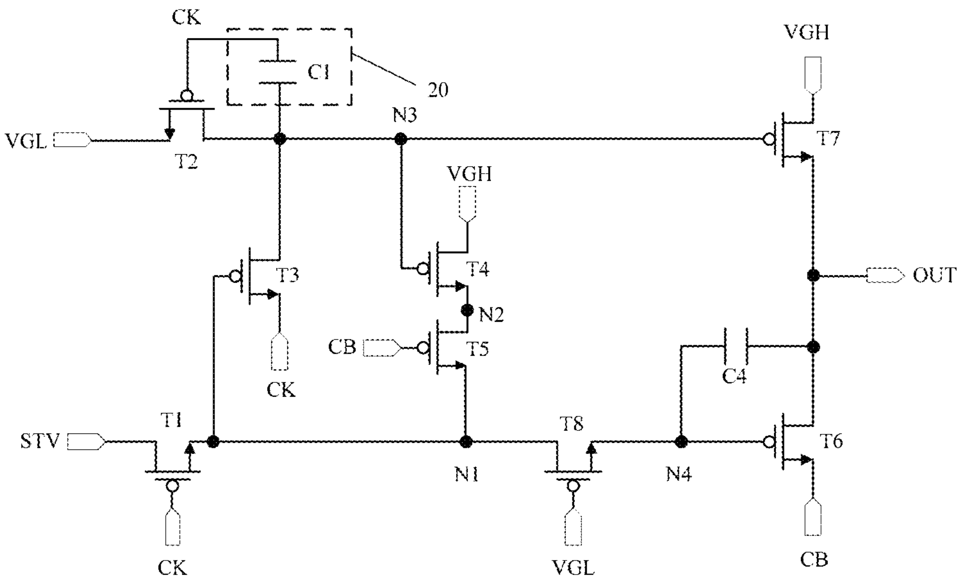
FIG. 6 is a circuit connection diagram of a third shift register unit according to an embodiment of the present disclosure.

Referring to FIG. 6, in another embodiment, after the first capacitor C1 is provided, the first capacitor C1 can be used to store the voltage of the pull-up node N3, so that the third capacitor C3 connected to the seventh transistor T7 can be omitted, and the normal output of the shift register unit can also be ensured.

Figure 7:
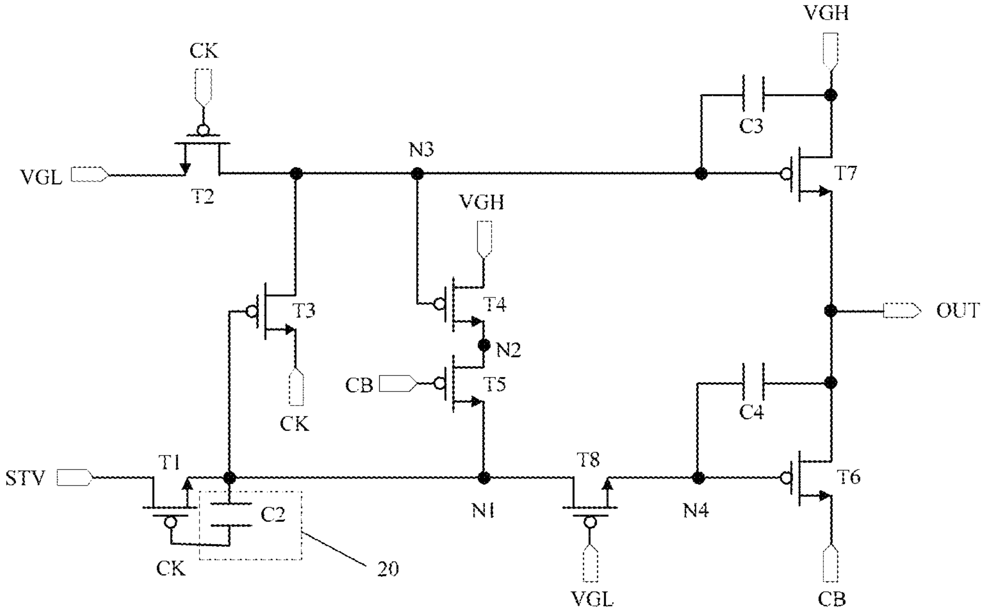
FIG. 7 is a circuit connection diagram of a fourth shift register unit according to an embodiment of the present disclosure.

Referring to FIG. 7, in the second case, the set node includes the pull-down node N1, and the voltage adjusting circuit 20 further includes a second capacitor C2.

A first terminal of the second capacitor C2 is coupled to the first clock signal terminal CK, and a second terminal of the second capacitor C2 is coupled to the pull-down node N1.

During implementation, when a signal at the first clock signal terminal CK changes from low to high, that is, during a turn-off process of the second transistor T2, a voltage of the pull-down node N1 is raised by the second capacitor C2, and in general, the voltage of the pull-down node N1 can be raised by 2 V to 3 V. In this way, the voltage impact on the voltage of the pull-down node N1 can be effectively alleviated, and gate-source voltages of the fifth transistor T5 and the sixth transistor T6 are Vgs=VGL-VGH=−2V-10V=−12V. Negative drifts of the fifth transistor T5 and the sixth transistor T6 are reduced, effectively ensuring the service life of the fifth transistor T5 and the sixth transistor T6.

Similarly, in another embodiment, after the second capacitor C2 is provided, the second capacitor C2 can be used to store the voltage of the pull-down node N1, so that the fourth capacitor C4 connected to the sixth transistor T6 can be omitted, and the normal output of the shift register unit can also be ensured.

Figure 8:
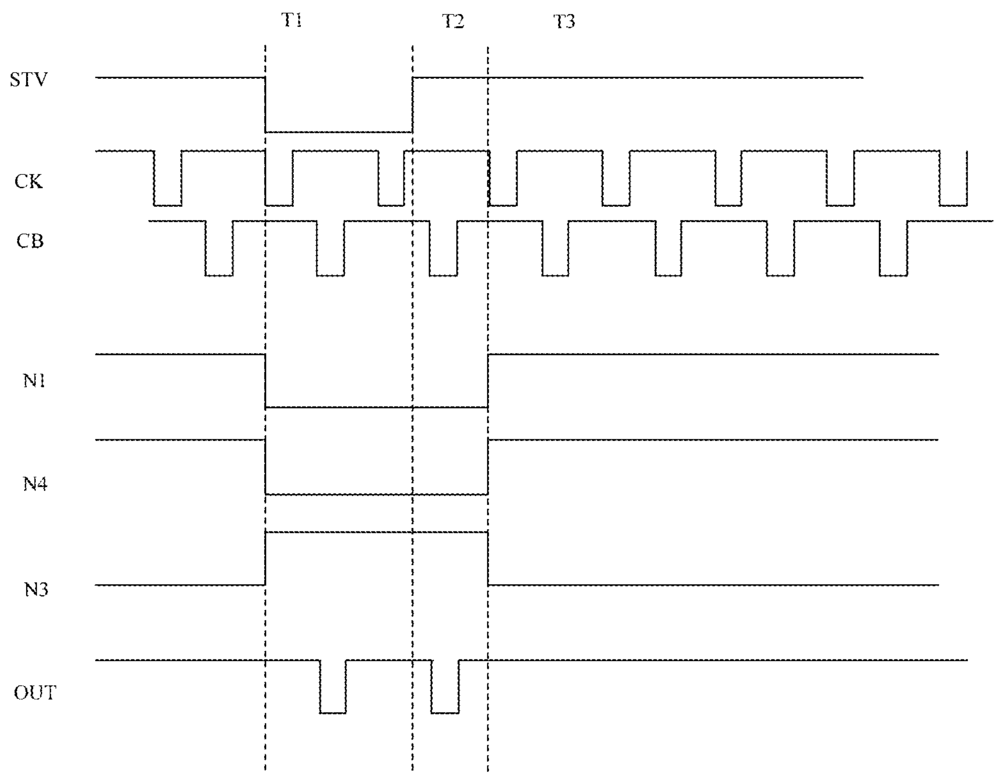
FIG. 8 is a timing diagram of a shift register unit according to an embodiment of the present disclosure.

Referring to FIG. 8, a main working process of the shift register unit is described below in combination with a timing diagram.

In a timing T1 phase: STV=0, CK=0, N1=0, N4=0, N3=1.

When the first clock signal terminal CK is at a low voltage, the first transistor T1 is turned on, and the input signal terminal STV is at a low voltage. In this case, the voltage of the pull-down node N1 is low, the voltage of the corresponding node N4 is also low, and the sixth transistor is turned on. The output terminal OUT outputs a waveform of the second clock signal terminal CB.

In a timing T2 phase: STV=1, CK=1, N1=0, N4=0, N3=1.

When the first clock signal terminal CK is at a high voltage, the first transistor T1 is turned off, and the input signal terminal STV is at a high voltage. In this case, the voltage of the pull-down node N1 is low, the voltage of the corresponding node N4 is also low, and the sixth transistor is turned on. The output terminal OUT still outputs the waveform of the second clock signal terminal CB.

In a timing T3 phase: STV=1, CK=0, N1=1, N4=1, N3=0.

When the first clock signal terminal CK is at a low voltage, the first transistor T1 is turned on, and the input signal terminal STV is at a high voltage. The voltage of the pull-down node N1 is high, the voltage of the corresponding node N4 is also high, and the sixth transistor is turned off. When the first clock signal terminal CK is at a low voltage, the second transistor T2 is turned on, the low voltage of the second reference signal terminal VGL causes the pull-up node N3 to be low, the corresponding seventh transistor is turned on. The high voltage of the first reference signal terminal VGH is output through the output terminal OUT.

In a phase after timing T3: STV=1, CK changes from low to high, N1=1, N4=1, N3=0.

When the first clock signal terminal CK changes from low to high, the first transistor and the second transistor change from on to off, the first capacitor C1 may raise the voltage at the pull-up node N3 due to CK coupling, reducing the negative drifts of the fourth transistor and the seventh transistor and ensuring the service life of the fourth transistor and the seventh transistor. Similarly, the second capacitor C2 raises the voltage at the pull-down node N1 due to the CK coupling, reducing the negative drifts of the fifth transistor and the sixth transistor and ensuring the service life of the fifth transistor and the sixth transistor.

Figure 9:
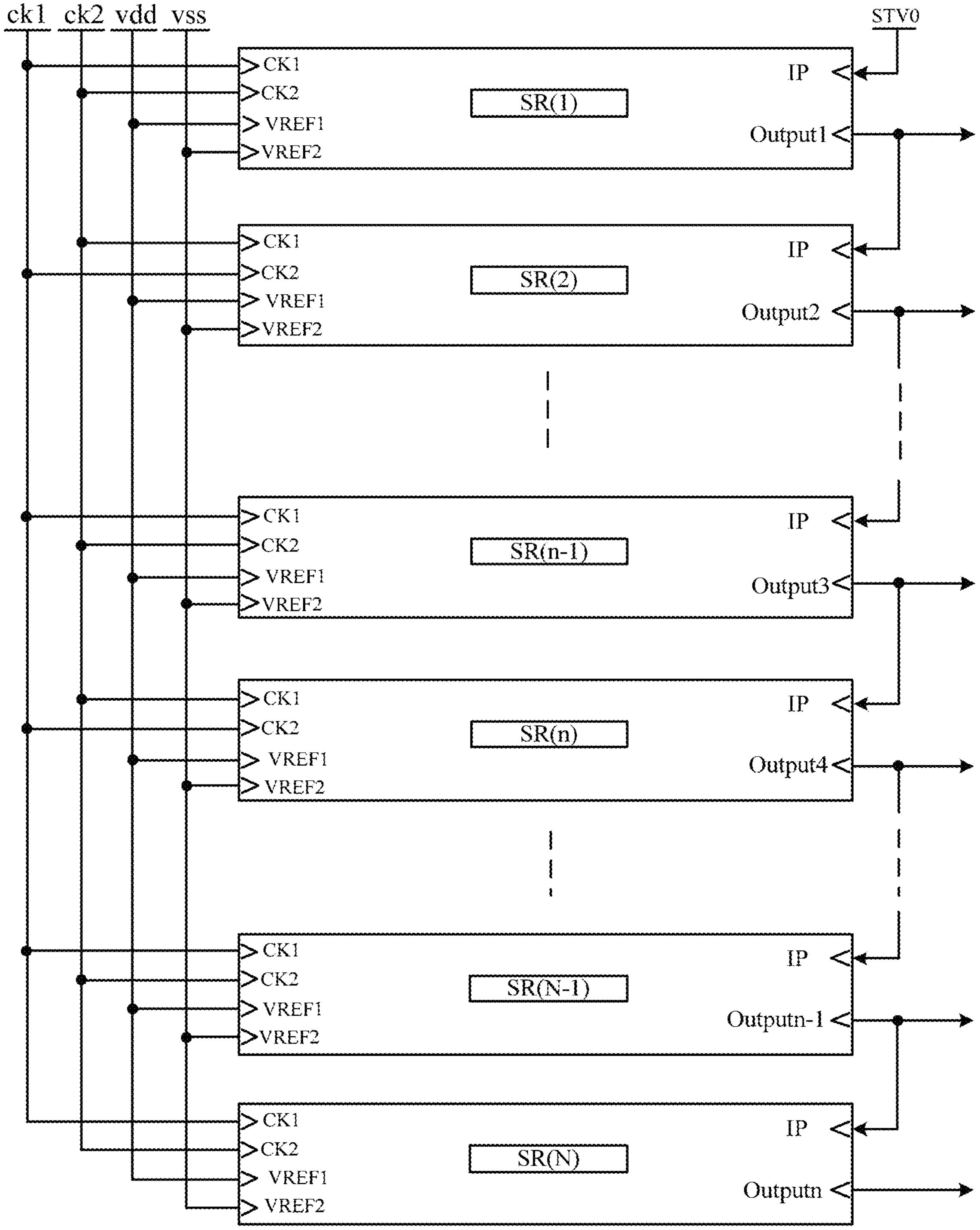
FIG. 9 is a schematic diagram of cascaded gate driving circuits according to an embodiment of the present disclosure.

Base on that same inventive concept, referring to FIG. 9, a gate driving circuit including a plurality of cascaded shift register units is provided according to embodiments of the present disclosure, and each of the cascaded shift register units includes the above shift register unit.

An input signal terminal of a shift register unit of a first stage is configured to be coupled to a frame start signal terminal.

In every two adjacent shift register units, an input signal terminal of a shift register unit of a next stage is configured to be coupled to an output terminal of a shift register unit of a previous stage.

Based on the same inventive concept, embodiments of the present disclosure provide a display device including the gate driving circuit described above.

The display device according to embodiments of the present disclosure may be any product or component with display function such as a tablet computer, a television, a display, a notebook computer, a digital photo frame, a navigator. Other essential components of the display device should be understood by those skilled in the art and should not be repeated here, nor should they be taken as limitations on this disclosure.

Figure 10:
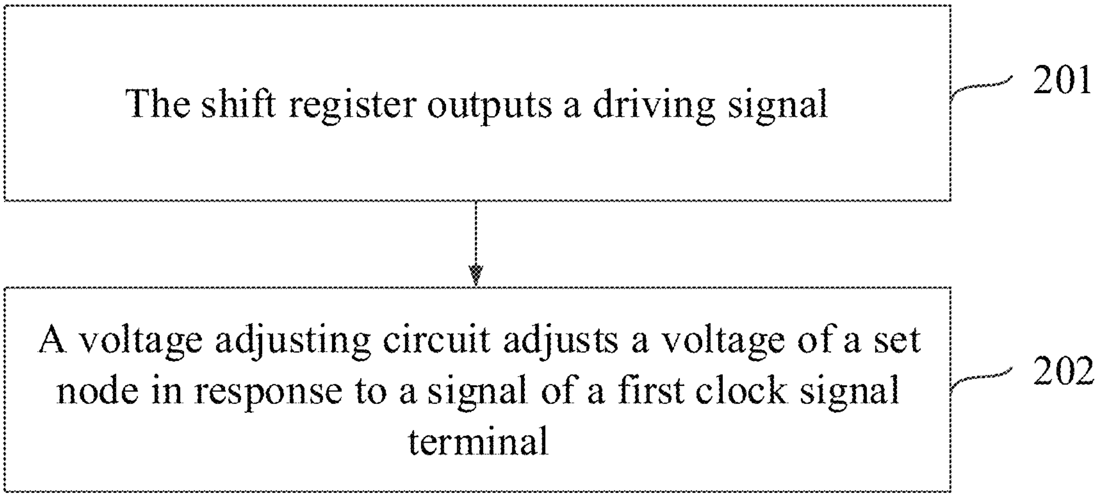
FIG. 10 is a flowchart of a method for driving a shift register according to an embodiment of the present disclosure.

Based on the same inventive concept, referring to FIG. 10, a driving method for a shift register is provided according to an embodiment of the present disclosure, and includes following steps.

Step 201: the shift register outputs a driving signal.

Referring to FIG. 4, when the seventh transistor is turned on, the signal of the first reference signal terminal reaches the output terminal of the shift register through the seventh transistor turned on. When the sixth transistor is turned on, the signal of the second clock signal terminal reaches the output terminal of the shift register through the sixth transistor turned on.

Step 202: a voltage adjusting circuit adjusts a voltage of a set node in response to a signal of a first clock signal terminal.

In the process of outputting the driving signal by the shift register, the voltage adjusting circuit adjusts the voltage at the set node in response to the signal of the first clock signal terminal CK. During specific implementation, the first capacitor adjusts the voltage of the pull-up node in response to the signal of the first clock signal terminal CK. The second capacitor adjusts the voltage of the pull-down node in response to the signal of the first clock signal terminal CK.

In summary, embodiments of the present disclosure provide a shift register unit, a gate driving circuit and a display device. The shift register unit includes a shift register and an anti-leakage circuit. The anti-leakage circuit is coupled to a set node of the shift register, and is configured to stabilize a voltage of the set node according to a signal of a leakage control signal terminal in a touch phase. That is, the aim of stabilizing the voltage is achieved at the set node by means of making up the leakage and inhibiting the leakage. Therefore, the leakage of the pull-up node of the shift register is effectively reduced, and the display effect is improved.

Those skilled in the art should understand that embodiments of the present disclosure can be provided as methods, systems or computer program product systems. Therefore, the present disclosure can adopt forms of full hardware embodiments, full software embodiments, or embodiments combining software and hardware aspects. Moreover, the present disclosure can adopt a form of the computer program product systems implemented on one or more computer available storage mediums (including but not limited to a disk memory, a CD-ROM, an optical memory and the like) containing computer available program codes.

The present disclosure is described with reference to flow charts and/or block diagrams of the methods, the devices (systems), and the computer program product systems according to embodiments of the present disclosure. It should be understood that each flow and/or block in the flow charts and/or the block diagrams and combinations of the flows and/or the blocks in the flow charts and/or the block diagrams can be implemented by computer program instructions. The computer program instructions may be provided to a processor of a general-purpose computer, a special-purpose computer, an embedded processing machine or other programmable data processing equipment, to generate a machine, such that the instructions, when executed by the processor of the computers or other programmable data processing equipment, generate devices for implementing functions specified in one or more flows in the flow charts and/or one or more blocks in the block diagrams.

The computer program instructions may also be stored in a computer readable memory which can guide the computers or other programmable data processing equipment to work in a specific mode, thus the instructions stored in the computer readable memory generates an article of manufacture that includes a commander device that implement the functions specified in one or more flows in the flow charts and/or one or more blocks in the block diagrams.

The computer program instructions may also be loaded to the computers or other programmable data processing equipment, so that a series of operating steps may be executed on the computers or other programmable equipment to generate computer-implemented processing, such that the instructions executed on the computers or other programmable equipment provide steps for implementing the functions specified in one or more flows in the flow charts and/or one or more blocks in the block diagrams.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

The computer program instructions may also be stored in a computer readable memory which can guide the computers or other programmable data processing equipment to work in a specific mode, thus the instructions stored in the computer readable memory generates an article of manufacture that includes a commander device that implement the functions specified in one or more flows in the flow charts and/or one or more blocks in the block diagrams.

The computer program instructions may also be loaded to the computers or other programmable data processing equipment, so that a series of operating steps may be executed on the computers or other programmable equipment to generate computer-implemented processing, such that the instructions executed on the computers or other programmable equipment provide steps for implementing the functions specified in one or more flows in the flow charts and/or one or more blocks in the block diagrams.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A shift register unit, comprising:

a shift register; and a voltage adjusting circuit, coupled to a set node of the shift register, and configured to adjust a voltage of the set node in response to a signal of a first clock signal terminal;

wherein the set node comprises a pull-up node, the voltage adjusting circuit comprises a first capacitor;

a first terminal of the first capacitor is coupled to the first clock signal terminal, and a second terminal of the first capacitor is coupled to the pull-up node;

wherein the first terminal of the first capacitor is directly connected to the first clock signal terminal;

wherein the set node comprises a pull-down node, the voltage adjusting circuit comprises a second capacitor;

a first terminal of the second capacitor is coupled to the first clock signal terminal, and a second terminal of the second capacitor is coupled to the pull-down node;

wherein the first terminal of the second capacitor is directly connected to the first clock signal terminal, and the second terminal of the second capacitor is directly connected to the pull-down node.

2. The shift register unit according to claim 1, wherein the shift register comprises:

an input circuit, configured to provide a signal of an input signal terminal to a pull-down node in response to the signal of the first clock signal terminal;

a node control circuit, configured to control a signal of a pull-up node and a signal of the pull-down node;

an output circuit, configured to provide a signal of a first reference signal terminal to an output terminal in response to the signal of the pull-up node, and provide a signal of a second clock signal terminal to the output terminal in response to the signal of the pull-down node.

3. The shift register unit according to claim 2, wherein the input circuit comprises: a first transistor;

a control terminal of the first transistor is coupled to the first clock signal terminal, a first terminal of the first transistor is coupled to the input signal terminal, and a second terminal of the first transistor is coupled to the pull-down node.

4. The shift register unit according to claim 2, wherein the node control circuit comprises a second transistor, a third transistor, a fourth transistor, and a fifth transistor;

a control terminal of the second transistor is coupled to the first clock signal terminal, a first terminal of the second transistor is coupled to a second reference signal terminal, and a second terminal of the second transistor is coupled to the pull-up node;

a control terminal of the third transistor is coupled to a second terminal of a first transistor, a first terminal of the third transistor is coupled to the pull-up node, and a second terminal of the third transistor is coupled to the first clock signal terminal;

a control terminal of the fourth transistor is coupled to the pull-up node, a first terminal of the fourth transistor is coupled to the first reference signal terminal, and a second terminal of the fourth transistor is coupled to a first terminal of the fifth transistor;

a control terminal of the fifth transistor is coupled to the second clock signal terminal, and a second terminal of the fifth transistor is coupled to the pull-down node.

5. The shift register unit according to claim 2, wherein the output circuit comprises a sixth transistor and a seventh transistor;

a control terminal of the sixth transistor is coupled to the pull-down node, a first terminal of the sixth transistor is coupled to the output terminal, and a second terminal of the sixth transistor is coupled to the second clock signal terminal;

a control terminal of the seventh transistor is coupled to the pull-up node, a first terminal of the seventh transistor is coupled to the first reference signal terminal, and a second terminal of the seventh transistor is coupled to the output terminal.

6. The shift register unit according to claim 2, wherein the output circuit comprises a third capacitor;

a first terminal of the third capacitor is coupled to the first reference signal terminal, and a second terminal of the third capacitor is coupled to the pull-up node.

7. The shift register unit according to claim 2, wherein the output circuit comprises a fourth capacitor;

a first terminal of the fourth capacitor is coupled to the output terminal, and a second terminal of the fourth capacitor is coupled to the pull-down node.

8. A gate driving circuit, comprising: a plurality of cascaded shift register units each according to claim 1; wherein:

an input signal terminal of a shift register unit of a first stage is configured to be coupled to a frame start signal terminal; and in every two adjacent shift register units, an input signal terminal of a shift register unit of a next stage is configured to be coupled to an output terminal of a shift register unit of a previous stage.

9. A display device, comprising the gate driving circuit according to claim 8.

10. A driving method of the shift register according to claim 1, comprising:

outputting, by the shift register, a driving signal;

adjusting, by the voltage adjusting circuit, the voltage of the set node of the shift register in response to the signal of the first clock signal terminal.

* * * * *